(12) United States Patent
Jiang et al.

(10) Patent No.: US 11,791,627 B2
(45) Date of Patent: *Oct. 17, 2023

(54) ESD PROTECTION CIRCUIT

(71) Applicant: Huawei Technologies Co., Ltd., Shenzhen (CN)

(72) Inventors: Qimeng Jiang, Shenzhen (CN); Yushan Li, Shenzhen (CN); Hanxing Wang, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/863,128

(22) Filed: Jul. 12, 2022

(65) Prior Publication Data

US 2023/0006440 A1 Jan. 5, 2023

Related U.S. Application Data

(63) Continuation of application No. 17/211,515, filed on Mar. 24, 2021, now Pat. No. 11,411,396, which is a (Continued)

(30) Foreign Application Priority Data

Sep. 25, 2018 (CN) .......................... 201811113733.0

(51) Int. Cl.
*H02H 9/04* (2006.01)
(52) U.S. Cl.
CPC .................................. *H02H 9/046* (2013.01)

(58) Field of Classification Search
CPC .. H02H 9/046; H01L 27/0266; H01L 27/0248
(Continued)

(56) References Cited

U.S. PATENT DOCUMENTS 6,118,640 A * 9/2000 Kwong .................. H02H 9/046
361/56
6,292,046 B1 * 9/2001 Ali ...................... H01L 27/0266
327/310
(Continued)

FOREIGN PATENT DOCUMENTS

CN 101640411 A 2/2010
CN 102280872 A 12/2011
(Continued)

*Primary Examiner* — Dharti H Patel
(74) *Attorney, Agent, or Firm* — Leydig, Voit & Mayer, Ltd.

(57) ABSTRACT

An ESD protection circuit is provided, including a negative ESD protection module and a positive ESD protection module, where the negative ESD protection module includes a first resistor, a charging capacitor, a first field effect transistor, and a second field effect transistor, and the positive ESD protection module includes a fourth field effect transistor. When a negative ESD event occurs, there is a comparatively large transient voltage at a gate of a P-type enhanced GaN power device relative to a source of the P-type enhanced GaN power device. Therefore, a displacement current from the source to the gate of the P-type enhanced GaN power device is generated on the charging capacitor. A voltage drop generated by the displacement current on the first resistor may enable the first field effect transistor and the second field effect transistor to form a path when the first field effect transistor is turned on.

11 Claims, 4 Drawing Sheets

Related U.S. Application Data continuation of application No. PCT/CN2019/099113, filed on Aug. 2, 2019.

(58) Field of Classification Search
   USPC .......................................................... 361/56
   See application file for complete search history.

(56) References Cited

U.S. PATENT DOCUMENTS

| | | | |
|---|---|---|---|
| 6,400,204 B1* | 6/2002 | Davis | H01L 27/0255 |
| | | | 361/91.1 |
| 11,081,881 B2* | 8/2021 | Agarwal | H02H 1/0007 |
| 11,411,396 B2* | 8/2022 | Jiang | H01L 27/0266 |
| 2003/0151865 A1* | 8/2003 | Maio | H01L 27/0266 |
| | | | 361/52 |
| 2006/0023380 A1* | 2/2006 | Lu | H02H 9/046 |
| | | | 361/56 |
| 2011/0038087 A1* | 2/2011 | Moronval | H01L 27/0248 |
| | | | 361/111 |
| 2011/0193171 A1 | 8/2011 | Yamagiwa et al. | |
| 2012/0154960 A1* | 6/2012 | Tsai | H02H 9/046 |
| | | | 361/56 |
| 2013/0155556 A1* | 6/2013 | Tsai | H01L 27/0251 |
| | | | 361/56 |
| 2014/0092508 A1 | 4/2014 | Ko et al. | |
| 2014/0376135 A1* | 12/2014 | Huo | H01L 27/0259 |
| | | | 361/56 |
| 2016/0149403 A1* | 5/2016 | Ikeda | H02H 9/041 |
| | | | 361/56 |
| 2016/0156178 A1* | 6/2016 | Yamamoto | H03K 17/693 |
| | | | 361/16 |
| 2016/0307886 A1* | 10/2016 | Roberts | H01L 27/0248 |
| 2016/0372920 A1* | 12/2016 | Kinzer | H01L 27/0266 |
| 2018/0026029 A1* | 1/2018 | Lin | H01L 28/20 |
| | | | 361/56 |
| 2019/0237456 A1* | 8/2019 | Lai | H03K 17/08104 |
| 2019/0237967 A1* | 8/2019 | Knoedgen | H01L 27/0629 |
| 2021/0249404 A1* | 8/2021 | Lai | H02H 9/046 |

FOREIGN PATENT DOCUMENTS

| | | | | |
|---|---|---|---|---|
| CN | 102437559 A | 5/2012 | | |
| CN | 102544115 A | 7/2012 | | |
| CN | 103151769 A | 6/2013 | | |
| CN | 104851880 A | 8/2015 | | |
| CN | 106505066 A | 3/2017 | | |
| CN | 107104102 A | 8/2017 | | |
| CN | 108306273 A | 7/2018 | | |
| CN | 109193601 A | * | 1/2019 | H01L 27/0248 |
| CN | 109193601 A | 1/2019 | | |
| WO | 2017030591 A1 | 2/2017 | | |
| WO | 2017074534 A1 | 5/2017 | | |

* cited by examiner

ESD PROTECTION CIRCUIT

CROSS-REFERENCE TO RELATED APPLICATIONS

This application is a continuation of U.S. patent application Ser. No. 17/211,515, filed on Mar. 24, 2021, which is a continuation of International Application No. PCT/CN2019/099113, filed on Aug. 2, 2019, which claims priority to Chinese Patent Application No. 201811113733.0, filed on Sep. 25, 2018. All of the aforementioned patent applications are hereby incorporated by reference in their entireties.

TECHNICAL FIELD

This application relates to the field of semiconductor technologies, and in particular, to an ESD protection circuit.

BACKGROUND

Wide bandgap semiconductor power devices are power devices based on third-generation semiconductor materials, and mainly include diamond power devices, silicon carbide (SiC) power devices, gallium nitride (GaN) power devices, and the like. The GaN power devices are widely used in the industry due to advantages such as a high breakdown electric field, a high electron saturation velocity, and high electron mobility in a heterostructure. Currently, mainstream lateral GaN power devices are based on aluminum gallium nitride AlGaN/GaN heterojunction structures, implement operation in an enhancement mode (that is, a normally-off device, for which a threshold voltage is defined as Vth>0) by introducing a special gate structure to deplete two-dimensional electron gas below a channel, and have been applied to power converters and related drive circuits. The special gate structure includes but is not limited to a P-type GaN gate structure (including a Schottky gate metal contact and an ohmic gate metal contact).

FIG. 1 is a schematic structural diagram of an enhanced lateral GaN power device based on the P-type GaN gate structure of the Schottky gate metal contact type. A source and a drain are connected to two-dimensional electron gas at an AlGaN/GaN interface by using ohmic metal. Gate metal is connected to P-type GaN and forms Schottky contact together with the P-type GaN. In a case, due to defects in a dielectric (SiO2, SiN, or the like) in the P-type GaN connected to a gate, at an AlGaN barrier layer, and on an AlGaN surface, or presence of residues from a manufacturing process, large gate leakage may occur in the device, which affects normal operation and long-term reliability of the device. To ensure reliability of devices, devices that operate abnormally or have reliability risks need to be screened out by using related tests. One of effective test methods is to apply a negative voltage to a gate (in this case, a source is grounded), observe a magnitude of a gate leakage current, and determine whether there is a reliability risk.

The enhanced GaN power device of the P-type GaN gate structure has a characteristic of a small gate capacitance, and a maximum withstand voltage of its gate is low (a direct current voltage is less than 6V for a long time, and a transient voltage is less than 10V). As a result, the device has comparatively poor resistance to an electrostatic discharge (electro-static discharge, ESD) event. Specifically, when a human body or a machine with static electricity comes in contact with a pin of the P-type enhanced GaN power device, an electrostatic discharge event occurs, and the static electricity of the charged body is discharged to the ground through the pin of the device. If an electrostatic discharge channel is not smooth or a capacitance of the device is small, the static electricity induces a comparatively high voltage on the device. When the induced voltage is higher than a withstand voltage between ends of the device, the device is burned. To improve an ESD capability of a GaN device, FIG. 2 shows a conventional gallium nitride-based ESD protection circuit, two ends of which are connected to a gate and a source of the power device separately. The ESD protection circuit mainly includes three parts: a clamp diode string 1, a two-dimensional electron gas resistor 2, and an ESD discharge low-voltage enhanced device 3. A working principle thereof is as follows: When a gate of a P-type enhanced GaN power device 30 undergoes a positive ESD event relative to a source, the clamp diode string 1 conducts, and a current conducted by the clamp diode string 1 forms a forward voltage drop on the two-dimensional electron-gas resistor 2. When a voltage of the voltage drop is higher than a threshold voltage of the ESD discharge low-voltage enhanced device 3, the ESD discharge low-voltage enhanced device 3 conducts, and positive ESD energy from the gate is released, to ensure that a gate voltage of the P-type enhanced GaN power device 30 does not exceed a positive withstand voltage of the P-type enhanced GaN power device 30. When the gate of the P-type enhanced GaN power device 30 undergoes a negative ESD event relative to the source, the ESD discharge low-voltage enhanced device 3 conducts reversely, and negative ESD energy from the gate is released, to ensure that a gate voltage of the P-type enhanced GaN power device 30 does not exceed the positive withstand voltage of the P-type enhanced GaN power device 30.

However, a conducted current is comparatively large in the foregoing ESD circuit when the gate and the source of the P-type enhanced GaN power device 30 have a reverse voltage bias. As a result, the ESD circuit is incompatible with a gate negative voltage test for detecting a gate-related defect, which makes it difficult for the device to have both reliability and ESD tolerance.

SUMMARY

This application provides a gallium nitride-based ESD protection circuit, which is compatible with a gate negative voltage test for a P-type enhanced GaN power device and also improves an ESD event tolerance capability of the power device.

According to a first aspect, this application provides an ESD protection circuit, including: a negative ESD protection module and a positive ESD protection module. The positive ESD protection module and the negative ESD protection module are connected in parallel. Two ends of the positive ESD protection module and two ends of the negative ESD protection module are connected to a gate and a source of a P-type enhanced GaN power device separately. The negative ESD protection module includes a first resistor, a charging capacitor, a first field effect transistor, and a second field effect transistor. One end of the first resistor is connected to the gate of the P-type enhanced GaN power device, and the other end of the first resistor is separately connected to a gate of the first field effect transistor and one end of the charging capacitor. A drain of the first field effect transistor is connected to the gate of the P-type enhanced GaN power device, and a source of the first field effect transistor is connected to a drain of the second field effect transistor. A gate and a source of the second field effect transistor are connected to the source of the P-type enhanced GaN power device. The positive ESD protection module includes a fourth field effect transistor. A gate and a drain of the fourth field effect transistor are connected to the gate of the P-type enhanced GaN power device, and a source of the fourth field effect transistor is connected to the source of the P-type enhanced GaN power device.

In this implementation, negative ESD is a comparatively high negative voltage with a quite small pulse width, and when a negative ESD event occurs in the P-type enhanced GaN power device, there is a comparatively large transient voltage at the gate of the P-type enhanced GaN power device relative to the source of the P-type enhanced GaN power device. Therefore, a displacement current from the source of the P-type enhanced GaN power device to the gate of the P-type enhanced GaN power device is generated on the charging capacitor, and the displacement current generates a voltage drop on the first resistor. When the voltage drop is greater than a threshold voltage of the first field effect transistor, the first field effect transistor is turned on. The first field effect transistor and the second field effect transistor form a path, thereby releasing negative ESD energy from the gate of the P-type enhanced GaN power device relative to the source of the P-type enhanced GaN power device. In addition, when a negative steady-state voltage is applied to the gate of the P-type enhanced GaN power device relative to the source of the P-type enhanced GaN power device, because there is no displacement current, there is no voltage drop across two ends of the first resistor, and the first field effect transistor is in an off state. Because leakage between the gate and the source is quite small, the negative ESD protection circuit unit can be compatible with a steady-state negative voltage test.

With reference to the implementation of the first aspect, in a first possible implementation of the first aspect, a clamp diode string is further disposed on the positive ESD protection module, where an anode of the clamp diode string is connected to the gate of the P-type enhanced GaN power device, and a cathode of the clamp diode string is connected to the source of the P-type enhanced GaN power device.

With reference to the first possible implementation of the first aspect, in a second possible implementation of the first aspect, a second resistor and a fifth field effect transistor are further disposed between the cathode of the clamp diode string and the P-type enhanced GaN power device, where the cathode of the clamp diode string is separately connected to one end of the second resistor and a gate of the fifth field effect transistor, a drain of the fifth field effect transistor is connected to the source of the fourth field effect transistor, and the other end of the second resistor and a source of the fifth field effect transistor are connected to the source of the P-type enhanced GaN power device.

With reference to any one of the first aspect, or the first to the second possible implementations of the first aspect, in a third possible implementation of the first aspect, when negative ESD occurs, the fourth field effect transistor is cut off.

With reference to the third possible implementation of the first aspect, in a fourth possible implementation of the first aspect, when the negative ESD occurs, a voltage is generated on the first resistor to control the first field effect transistor to conduct.

With reference to the fourth possible implementation of the first aspect, in a fifth possible implementation of the first aspect, when positive ESD occurs, the second field effect transistor is cut off.

According to a second aspect, this application provides an ESD protection circuit, including a positive ESD protection module and a negative ESD protection module. The negative ESD protection module includes a first resistor, a charging capacitor, and a first field effect transistor. One end of the first resistor is separately connected to a drain of the first field effect transistor and a gate of a P-type enhanced GaN power device, and the other end of the first resistor is separately connected to a gate of the first field effect transistor and one end of the charging capacitor. The other end of the charging capacitor and a source of the first field effect transistor are connected to a source of the P-type enhanced GaN power device. The positive ESD protection module includes a sixth field effect transistor, where a source of the sixth field effect transistor is connected to the source of the P-type enhanced GaN power device, and both a gate and a drain of the sixth field effect transistor are connected to the drain of the first field effect transistor. A third field effect transistor is further connected between the first resistor and the first field effect transistor, where a gate of the third field effect transistor is connected to one end of the first resistor, a source of the third field effect transistor is connected to the drain of the first field effect transistor, and a drain of the third field effect transistor is connected to the gate of the P-type enhanced GaN power device.

When a negative ESD event occurs in the P-type enhanced GaN power device, there is a comparatively large transient voltage at the gate of the P-type enhanced GaN power device relative to the source of the P-type enhanced GaN power device. Therefore, a displacement current from the source of the P-type enhanced GaN power device to the gate of the P-type enhanced GaN power device is generated on the charging capacitor, and the displacement current generates a voltage drop on the first resistor. When the voltage drop is greater than threshold voltages of the first field effect transistor and the third field effect transistor, the first field effect transistor and the third field effect transistor are turned on. The first field effect transistor and the third field effect transistor form a path, thereby releasing negative ESD energy from the gate of the P-type enhanced GaN power device relative to the source of the P-type enhanced GaN power device. In addition, when a negative steady-state voltage is applied to the gate of the P-type enhanced GaN power device relative to the source of the P-type enhanced GaN power device, because there is no displacement current, there is no voltage drop across two ends of the first resistor, and the first field effect transistor is in an off state. Because leakage between the gate and the source is quite small, the negative ESD protection circuit unit can be compatible with a steady-state negative voltage test.

With reference to the implementation of the second aspect, in a first possible implementation of the second aspect, a clamp diode string is further disposed on the positive ESD protection module, where an anode of the clamp diode string is connected to the gate of the P-type enhanced GaN power device, and a cathode of the clamp diode string is separately connected to the one end of the first resistor and the gate of the third field effect transistor.

With reference to the first possible implementation of the second aspect, in a second possible implementation of the second aspect, a third resistor is further disposed between the clamp diode string and the first resistor. One end of the third resistor is separately connected to the cathode of the clamp diode string and the gate of the third field effect transistor, and the other end of the third resistor is separately connected to one end of the first resistor and the drain of the first field effect transistor.

With reference to any one of the second aspect, or the first to the second possible implementations of the second aspect, in a third possible implementation of the second aspect, when negative ESD occurs, a voltage is generated on the first resistor to control the first field effect transistor and the third field effect transistor to conduct.

With reference to the third possible implementation of the second aspect, in a fourth possible implementation of the second aspect, when positive ESD occurs, a voltage is generated on the third resistor to control the third field effect transistor to conduct.

BRIEF DESCRIPTION OF DRAWINGS

To describe the technical solutions in this application more clearly, the following briefly describes the accompanying drawings for describing the embodiments. Apparently, a person of ordinary skill in the art may derive other drawings from these accompanying drawings without creative efforts.

DESCRIPTION OF EMBODIMENTS

To make a person skilled in the art understand the technical solutions in the embodiments of this application better, the following further describes the technical solutions in the embodiments of this application in detail with reference to the accompanying drawings.

When negative ESD occurs at a gate of a P-type enhanced GaN power device, an ESD protection circuit in the conventional art causes a large negative current at the gate of the P-type enhanced GaN power device, thus flooding original negative leakage of the gate of the P-type enhanced GaN power device. Therefore, when a conventional ESD protection circuit is used, product reliability of a P-type enhanced GaN power device cannot be guaranteed. However, if an ESD protection circuit is not used, there is a loss in a qualification ratio of a P-type enhanced GaN power device. In view of this, a new ESD protection circuit is proposed in this application. It should be noted that, unless otherwise specified, an enhanced device (or a device) in the following description includes but is not limited to an enhanced GaN device of a P-type GaN gate structure. Unless otherwise specified, a resistor in the following description includes but is not limited to a two-dimensional electron-gas resistor and an integrated film resistor. Unless otherwise specified, a capacitor in the following description includes but is not limited to an MIM capacitor and a P-GaN gate MOS capacitor.

Figure 1:
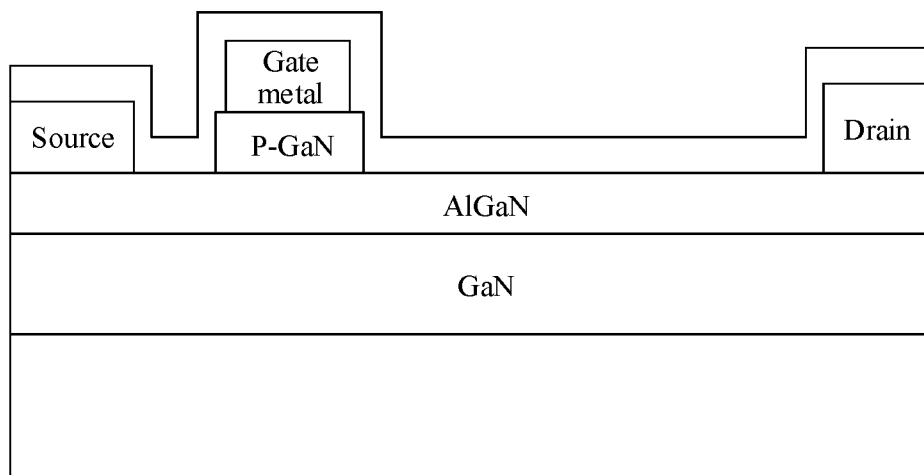
FIG. 1 is a schematic structural diagram of a conventional P-type enhanced GaN power device.
Figure 2:
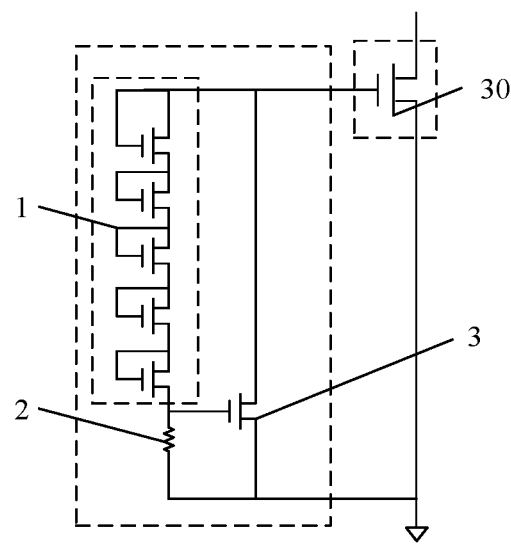
FIG. 2 is a schematic structural diagram of a conventional ESD protection circuit.
Figure 3:
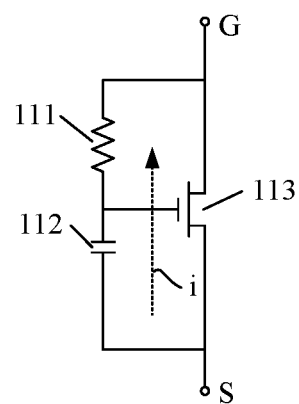
FIG. 3 is a schematic structural diagram of a basic unit of a negative ESD protection circuit according to an embodiment of this application.

As shown in FIG. 3, this application first proposes a negative ESD protection circuit unit. The negative ESD protection circuit unit includes a first resistor 111, a charging capacitor 112, and a first field effect transistor 113, where the first field effect transistor 113 is used as a trigger component in the negative ESD protection circuit unit. When being applied to an ESD protection circuit, a drain of the first field effect transistor 113 is connected to a gate of a P-type enhanced GaN power device 30, and a source of the first field effect transistor 113 is connected to a source of the P-type enhanced GaN power device 30. When a negative ESD event occurs in the P-type enhanced GaN power device 30, there is a comparatively large transient voltage at the gate of the P-type enhanced GaN power device 30 relative to the source of the P-type enhanced GaN power device 30. Therefore, a displacement current i from the source of the P-type enhanced GaN power device 30 to the gate of the P-type enhanced GaN power device 30 is generated on the charging capacitor 112, and the displacement current generates a voltage drop on the first resistor 111. When the voltage drop is greater than a threshold voltage of the first field effect transistor 113, the first field effect transistor 113 is turned on, thereby releasing negative ESD energy from the gate of the P-type enhanced GaN power device 30 relative to the source of the P-type enhanced GaN power device 30.

When a negative steady-state voltage is applied to the gate of the P-type enhanced GaN power device 30 relative to the source of the P-type enhanced GaN power device 30, because there is no displacement current, there is no voltage drop across two ends of the first resistor 111, and the first field effect transistor 113 is in an off state. Because leakage between the gate and the source is quite small, the negative ESD protection circuit unit can be compatible with a steady-state negative voltage test.

Forward leakage of the circuit unit shown in FIG. 3 is comparatively large. Therefore, two circuit structures in FIG. 4 and FIG. 5 are derived based on a structure in FIG. 3.

Figure 4:
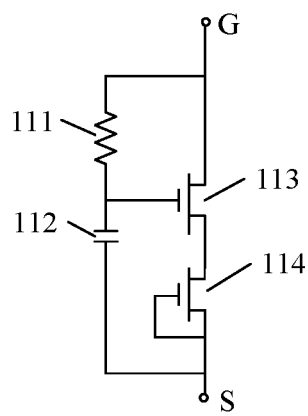
FIG. 4 is a schematic structural diagram of a negative ESD protection circuit unit based on FIG. 3 according to an embodiment of this application.

As shown in FIG. 4, compared with FIG. 3, a second field effect transistor 114 using a diode connection method is added. A drain of the second field effect transistor 114 is connected to the source of the first field effect transistor 113, thereby blocking a forward leakage path. In a condition that a negative ESD event is triggered, the second field effect transistor 114 is always in a conductive state, and does not hinder discharge of negative ESD energy.

Figure 5:
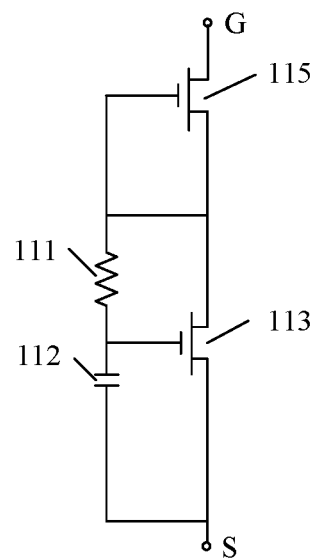
FIG. 5 is a schematic structural diagram of another negative ESD protection circuit unit based on FIG. 3 according to an embodiment of this application.

As shown in FIG. 5, compared with FIG. 3, a third field effect transistor 115 using a diode connection method is added. A source of the second field effect transistor 115 is connected to a drain of the first field effect transistor 113. The diode connection method of the third field effect transistor 115 can also effectively block the forward leakage path.

Figure 6:
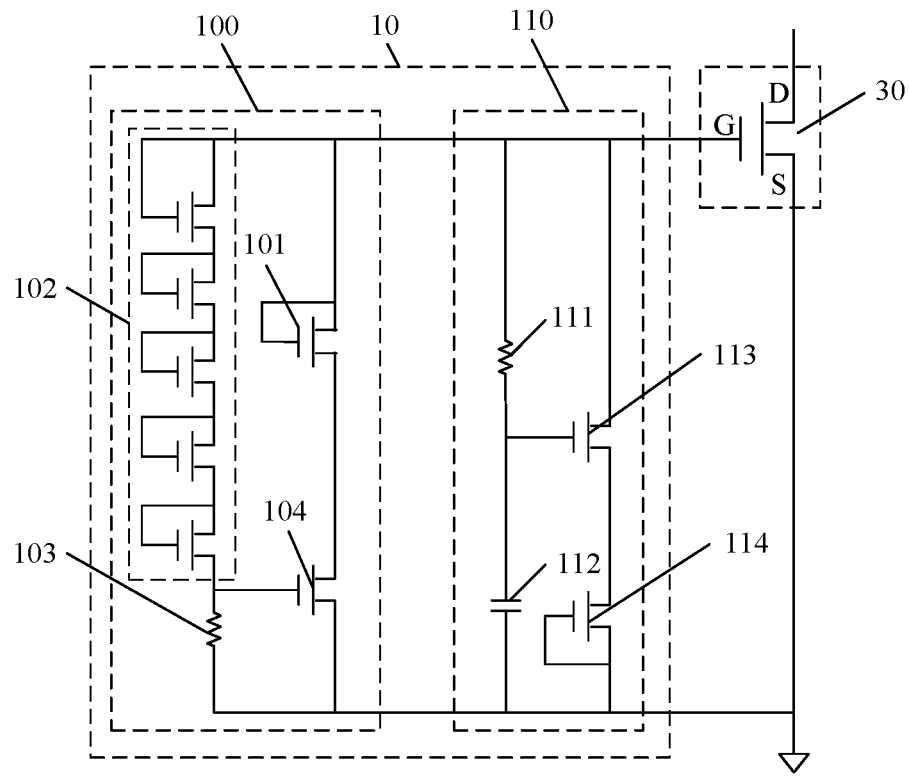
FIG. 6 is a schematic structural diagram of an ESD protection circuit according to an embodiment of this application.

Based on a negative ESD protection circuit unit shown in FIG. 4, an embodiment of this application provides an ESD protection circuit 10. FIG. 6 is a schematic structural diagram of an ESD protection circuit according to an embodiment of this application. The ESD protection circuit 10 provided in this embodiment includes a positive ESD protection module 100 and a negative ESD protection module 110. The positive ESD protection module 100 and the negative ESD protection module 110 are connected in parallel. Two ends of the positive ESD protection module 100 and two ends of the negative ESD protection module 110 are separately connected to a gate G and a source S of a P-type enhanced GaN power device 200. The positive ESD protection module 100 and the negative ESD protection module 110 are respectively configured to release energy when a positive ESD event and a negative ESD event occur at the gate of the P-type enhanced GaN power device 30.

The positive ESD protection module 100 includes a fourth field effect transistor 101 using a diode connection method, a clamp diode string 102 formed by connecting a plurality of enhanced components in series, a second resistor 103, and a fifth field effect transistor 104. A gate and a drain of the fourth field effect transistor 101 are connected to the gate of the P-type enhanced GaN power device 30. A source of the fourth field effect transistor 101 is connected to a drain of the fifth field effect transistor 104. An anode of the clamp diode string 102 is connected to the gate of the P-type enhanced GaN power device 30, and a cathode of the clamp diode string 102 is separately connected to one end of the second resistor 103 and a gate of the fifth field effect transistor 104. The clamp diode string 102 is formed by connecting, in series, a plurality of components that use the diode connection method. The other end of the second resistor 103 and a source of the fifth field effect transistor 104 are connected to the source of the P-type enhanced GaN power device 30. It should be noted that a quantity of components connected in series to form the clamp diode string 102 may be adjusted based on an actual application scenario, and is not limited to a quantity currently shown in FIG. 6. FIG. 6 is merely an example. The diode connection method of a field effect transistor is a connection manner in which a drain or a source of the field effect transistor is connected to a gate of the field effect transistor.

When the gate of the P-type enhanced GaN power device 30 undergoes a positive ESD event, a forward voltage induced by the gate enables the clamp diode string 102 to conduct, forming a current that flows through the second resistor 103. When a forward voltage on the second resistor 103 exceeds a threshold voltage of the fifth field effect transistor 104, the fourth field effect transistor 101 conducts, so that a series-connected branch circuit between the fourth field effect transistor 101 and the fourth field effect transistor 101 conducts, thereby achieving an objective of releasing positive ESD energy.

In this embodiment, because the fourth field effect transistor 101 uses the diode connection method as a connection manner, the fourth field effect transistor 101 can only conduct unidirectionally. Therefore, when the gate of the P-type enhanced GaN power device 30 has a negative voltage relative to the source of the P-type enhanced GaN power device 30, the positive ESD module 100 does not conduct.

The negative ESD protection module 110 in FIG. 6 uses the negative ESD protection circuit unit shown in FIG. 4, and includes a first resistor 111, a charging capacitor 112, a first field effect transistor 113, and a second field effect transistor 114. One end of the first resistor 111 is connected to the gate of the P-type enhanced GaN power device 30, and the other end of the first resistor 111 is separately connected to a gate of the first field effect transistor 113 and one end of the charging capacitor 112. A drain of the first field effect transistor 113 is connected to the gate of the P-type enhanced GaN power device 30, a source of the first field effect transistor 113 is connected to a drain of the second field effect transistor 114, and both a gate and a source of the second field effect transistor 114 are connected to the source of the P-type enhanced GaN power device 30.

Because the negative ESD protection circuit unit shown in FIG. 4 is used, there is quite small leakage on the negative ESD protection module 110 when a negative leakage test is performed on the gate of the P-type enhanced GaN power device 30. Therefore, the negative ESD protection module 110 can be compatible with the negative leakage test on the gate of the P-type enhanced GaN power device 30. When the gate of the P-type enhanced GaN power device 30 undergoes a negative ESD event, as described in a function of the negative ESD protection circuit unit in FIG. 4, the negative ESD event causes a displacement current i to be generated on the charging capacitor 112. The displacement current i flows through the first resistor 111 to generate a voltage drop. When the voltage drop is greater than a threshold voltage of the first field effect transistor 113, a series-connected path between the first field effect transistor 113 and the second field effect transistor 114 conducts, and negative ESD energy can be released.

The ESD protection circuit provided in the foregoing embodiment includes the positive ESD module 100 and the negative ESD module 110. The ESD protection circuit has both positive and negative ESD event protection capabilities, and is compatible with a steady-state negative voltage leakage test on a gate of a power tube.

Figure 7:
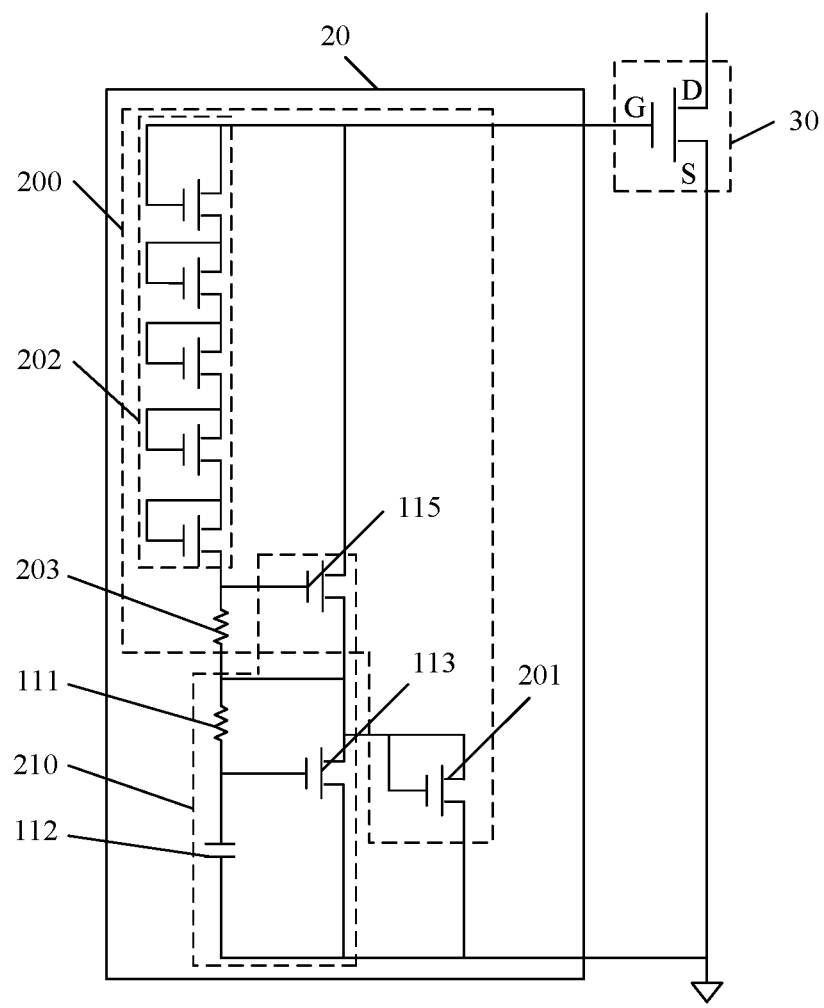
FIG. 7 is a schematic structural diagram of another ESD protection circuit according to an embodiment of this application.

Based on the negative ESD protection circuit unit shown in FIG. 5, an embodiment of this application further provides another ESD protection circuit 20. Referring to FIG. 7, the ESD protection circuit 20 also includes a positive ESD protection module 200 and a negative ESD protection module 210. The ESD protection module 200 and the negative ESD protection module 210 share a third field effect transistor 115. The negative ESD protection module 210 uses the negative ESD protection circuit unit shown in FIG. 5.

The negative ESD protection module 210 includes a first resistor 111, a charging capacitor 112, and the third field effect transistor 115. One end of the first resistor 111 is separately connected to a drain of a first field effect transistor 113 and a gate of the third field effect transistor 115, and the other end of the first resistor 111 is separately connected to a gate of the first field effect transistor 113 and one end of the charging capacitor 112. Both the other end of the charging capacitor 112 and a source of the first field effect transistor 113 are connected to a source of a P-type enhanced GaN power device 30. A source of the third field effect transistor 115 is connected to a drain of the third field effect transistor 115, and the drain of the third field effect transistor 115 is connected to a gate of the P-type enhanced GaN power device 30.

When the P-type enhanced GaN power device 30 undergoes a negative ESD event, as described above, the negative ESD event causes a transient negative voltage with a quite small pulse width and a quite high change slope to be generated. The transient negative voltage causes a displacement current to be generated. The generated displacement current charges the charging capacitor 112, and further a voltage is generated on the first resistor 111. The voltage on the first resistor 111 enables the first field effect transistor 113 to conduct. In this case, a path between the first field effect transistor 113 and the third field effect transistor 115 conducts, and negative ESD energy is released. Because the first resistor 111 does not have a voltage drop in a steady state, in a condition of a negative steady-state leakage test on the gate of the P-type enhanced GaN power device 30, the first field effect transistor 113 is turned off, so that there is no large leakage current in the negative direction. In other words, the negative ESD protection module 210 is compatible with the negative leakage test on the gate of the P-type enhanced GaN power device 30.

To ensure that positive ESD energy can be smoothly released when positive ESD occurs at the gate of the P-type enhanced GaN power device 30, the positive ESD protection module 200 in the ESD protection circuit provided in this embodiment includes components of a sixth field effect transistor 201, a clamp diode string 202, and a third resistor 203.

A source of the sixth field effect transistor 201 is connected to the source of the P-type enhanced GaN power device 30, and a gate and a drain of the sixth field effect transistor 201 are connected to the source of the third field effect transistor 115. An anode of the clamp diode string 202 is connected to the gate of the P-type enhanced GaN power device 30, and a cathode of the clamp diode string 202 is separately connected to one end of the third resistor 203 and the gate of the third field effect transistor 115. The other end of the third resistor 203 is separately connected to one end of the first resistor 111 and the drain of the first field effect transistor 113.

When the gate of the P-type enhanced GaN power device 30 undergoes a positive ESD event, a positive voltage induced by the positive ESD event enables a series-connected path among the clamp diode string 202, the third resistor 203, and the sixth field effect transistor 201 to conduct. When a voltage drop on the third resistor 203 is higher than a threshold voltage of the third field effect transistor 115, a path between the third field effect transistor 115 and the sixth field effect transistor 201 conducts, and positive ESD energy is discharged.

Based on the basic description of the positive ESD module 200 and the negative ESD module 210, a second gallium nitride-based ESD protection circuit provided in this embodiment has both positive and negative ESD event protection capabilities, and is compatible with a steady-state negative voltage leakage test on a gate of a power tube.

It should be noted that in this specification, relational terms such as first and second are only used to distinguish one entity or operation from another, and do not necessarily require or imply that any actual relationship or sequence exists between these entities or operations. Moreover, the terms "include", "comprise", or their any other variant is intended to cover a non-exclusive inclusion, so that a process, a method, an article, or a device that includes a list of elements not only includes those elements but also includes other elements that are not expressly listed, or further includes elements inherent to such a process, method, article, or device. An element preceded by "includes a . . . " does not, without more constraints, preclude the presence of additional identical elements in the process, method, article, or device that includes the element.

The foregoing descriptions are implementation manners of this application, but are not intended to limit the protection scope of this application.

What is claimed is:

1. An electrostatic discharge (ESD) protection circuit, comprising:
a negative ESD protection module and a positive ESD protection module, wherein the positive ESD protection module and the negative ESD protection module are connected in parallel, and two ends of the positive ESD protection module and two ends of the negative ESD protection module are separately connected to a gate and a source of a power device;
wherein: the negative ESD protection module comprises a first resistor, a charging capacitor, a first field effect transistor, and a second field effect transistor; a first end of the first resistor is connected to the gate of the power device, and a second end of the first resistor is separately connected to a gate of the first field effect transistor and a first end of the charging capacitor; a drain of the first field effect transistor is connected to a gate of the power device, and a source of the first field effect transistor is connected to a drain of the second field effect transistor; and a gate and a source of the second field effect transistor are connected to the source of the power device; and
wherein the positive ESD protection module comprises a fourth field effect transistor, wherein a gate and a drain of the fourth field effect transistor are connected to the gate of the power device, and a source of the fourth field effect transistor is connected to the source of the power device.

2. The ESD protection circuit according to claim 1, wherein a clamp diode string is further disposed on the positive ESD protection module, an anode of the clamp diode string is connected to the gate of the power device, and a cathode of the clamp diode string is connected to the source of the power device.

3. The ESD protection circuit according to claim 2, wherein: a second resistor and a fifth field effect transistor are further disposed between the cathode of the clamp diode string and the power device; the cathode of the clamp diode string is separately connected to a first end of the second resistor and a gate of the fifth field effect transistor; a drain of the fifth field effect transistor is connected to the source of the fourth field effect transistor; and a second end of the second resistor and a source of the fifth field effect transistor are connected to the source of the power device.

4. The ESD protection circuit according to claim 1, wherein responsive to the occurrence of a negative ESD, the fourth field effect transistor is cut off.

5. The ESD protection circuit according to claim 4, wherein responsive to the occurrence of the negative ESD, a voltage is generated across the first resistor to control the first field effect transistor to conduct.

6. The ESD protection circuit according to claim 5, wherein responsive to the occurrence of a positive ESD, the second field effect transistor is cut off.

7. An ESD protection circuit, comprising:
a positive ESD protection module and a negative ESD protection module, wherein:
the negative ESD protection module comprises a first resistor, a charging capacitor, and a first field effect transistor; a first end of the first resistor is separately connected to a drain of the first field effect transistor and a gate of a power device, and a second end of the first resistor is separately connected to a gate of the first field effect transistor and a first end of the charging capacitor; and a second end of the charging capacitor and a source of the first field effect transistor are connected to a source of the power device;
the positive ESD protection module comprises a sixth field effect transistor, wherein a source of the sixth field effect transistor is connected to the source of the power device, and both a gate and a drain of the sixth field effect transistor are connected to the drain of the first field effect transistor; and
a third field effect transistor is further connected between the first resistor and the first field effect transistor, wherein a gate of the third field effect transistor is connected to a first end of the first resistor, a source of the third field effect transistor is connected to the drain of the first field effect transistor, and a drain of the third field effect transistor is connected to the gate of the power device.

8. The ESD protection circuit according to claim 7, wherein a clamp diode string is further disposed on the positive ESD protection module, an anode of the clamp diode string is connected to the gate of the power device, and a cathode of the clamp diode string is separately connected to the first end of the first resistor and the gate of the third field effect transistor.

9. The ESD protection circuit according to claim 8, wherein a third resistor is further disposed between the clamp diode string and the first resistor, a first end of the third resistor is separately connected to the cathode of the clamp diode string and the gate of the third field effect transistor, and the a second end of the third resistor is connected to the first end of the first resistor and the drain of the first field effect transistor.

10. The ESD protection circuit according to claim 7, wherein responsive to the occurrence of a negative ESD, a voltage is generated across the first resistor to control the first field effect transistor and the third field effect transistor to conduct.

11. The ESD protection circuit according to claim 10, wherein responsive to the occurrence of the negative ESD, a voltage is generated across the third resistor to control the third field effect transistor to conduct.

* * * * *